US008174426B2

(12) United States Patent
Henzler

(10) Patent No.: US 8,174,426 B2
(45) Date of Patent: May 8, 2012

(54) METHOD AND SYSTEM FOR CONVERTING TIME INTERVALS

(75) Inventor: Stephan Henzler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 12/887,567

(22) Filed: Sep. 22, 2010

(65) Prior Publication Data

US 2011/0074618 A1 Mar. 31, 2011

(30) Foreign Application Priority Data

Sep. 30, 2009 (DE) ......................... 10 2009 047 860

(51) Int. Cl.
*H03M 1/50* (2006.01)

(52) U.S. Cl. ......................... 341/166; 341/155; 341/157

(58) Field of Classification Search .................. 341/166, 341/157, 155
See application file for complete search history.

(56) References Cited

U.S. PATENT DOCUMENTS

| | | | | |
|---|---|---|---|---|
| 7,330,144 | B2 * | 2/2008 | Terazawa et al. | 341/157 |
| 7,629,915 | B2 * | 12/2009 | Lin | 341/166 |
| 7,706,496 | B2 * | 4/2010 | Youssoufian | 375/376 |
| 7,804,290 | B2 * | 9/2010 | Henzler et al. | 324/76.82 |
| 7,893,861 | B2 * | 2/2011 | Bulzacchelli et al. | 341/166 |
| 8,064,561 | B2 * | 11/2011 | Henzler | 375/371 |

FOREIGN PATENT DOCUMENTS

DE 102008047163 A1 3/2009

* cited by examiner

*Primary Examiner* — Khai M Nguyen
(74) *Attorney, Agent, or Firm* — Infineon Technologies AG Patent Department

(57) ABSTRACT

A method and a system for converting time intervals are provided. In one embodiment, the system comprises a first time-to-digital converter having a first resolution configured to convert a first time interval, a second time-to-digital converter having a second resolution configured to convert a second time interval, and a third time-to-digital converter having a third resolution and coupled to the first time-to-digital converter and the second time-to-digital converter, the third time-to-digital converter configured to convert a third time interval and a fourth time interval.

35 Claims, 9 Drawing Sheets

METHOD AND SYSTEM FOR CONVERTING TIME INTERVALS

REFERENCE TO RELATED APPLICATION

This application claims the benefit of the priority date of German application 102009047860.4 filed on Sep. 30, 2009, the entire content of which are herein incorporated by reference.

TECHNICAL FIELD

The present invention relates generally to time interval measurements. In particular, the present disclosure relates to a method and system for improved time interval conversions.

BACKGROUND

In many areas of engineering, accurate measurement of a time interval is useful. For example, accurate measurement of a time interval is used in a phase detector of a digital phase locked loop (PLL). In addition, accurate measurement of a time interval is used in analog-to-digital converters and in high-resolution measuring equipment.

Often, time-to-digital converters (TDC) are used in order to perform accurate measurement of a time interval. After a time interval has been measured by a time-to-digital converter, it is necessary to wait a certain time until the time-to-digital converter is ready for a fresh measurement. This time is referred to as dead time for a time-to-digital converter. In order to allow measurement of time intervals without dead time, it is possible to alternatively use two time-to-digital converters which are connected in parallel. This is called time interleaving. The arrangement has the associated drawback that a mismatch in the two parallel-connected time-to-digital converters, which is caused by process variations, for example, results in the occurrence of a periodically occurring conversion error. In addition, such an arrangement takes up a large surface area. Therefore, a need exists for a method and system for improved time interval conversions.

SUMMARY OF INVENTION

The present disclosure provides a system and method for converting time intervals. In one embodiment, the system comprises a first time-to-digital converter having a first resolution configured to convert a first time interval, a second time-to-digital converter having a second resolution configured to convert a second time interval, and a third time-to-digital converter having a third resolution and coupled to the first time-to-digital converter and the second time-to-digital converter, the third time-to-digital converter configured to convert a third time interval and a fourth time interval.

In another embodiment, an analog to digital converter is provided comprising a pulse modulator configured to convert an analog signal into a pulse-modulated signal, at least one time-to-digital converter coupled to the pulse modulator configured to convert the pulse-modulated signal into at least one digital value, and a digital processing unit coupled to the at least one time-to-digital converter configured to process the at least one digital value.

In yet another embodiment, a method for converting time intervals is provided. The method comprises converting a first time interval in a first time-to-digital converter, converting a second time interval in a second time-to-digital converter, controlling a conversion of a third time interval in a third time-to-digital converter, decoupling the first time-to-digital converter from the third time-to-digital converter; an, controlling a conversion of a fourth time interval in the third time-to-digital converter.

DETAILED DESCRIPTION

Figure 1:
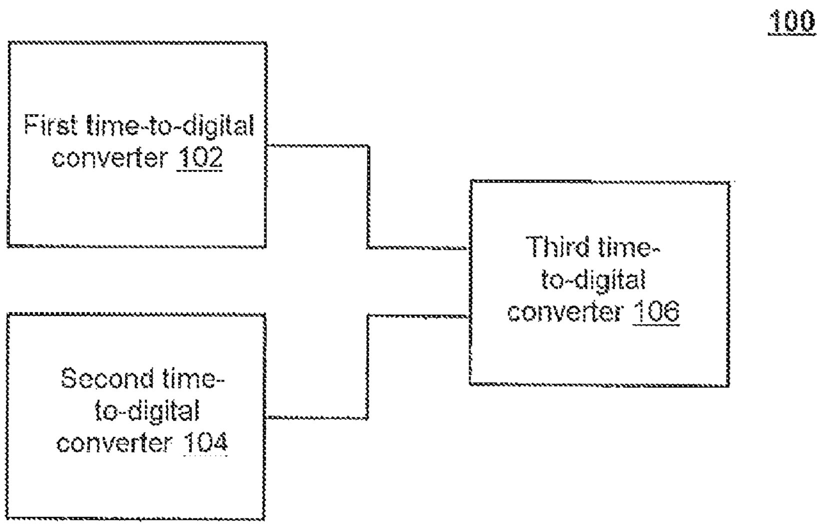
FIG. 1 is a diagram illustrating a system for converting time intervals in accordance with one embodiment of the present disclosure.

Referring to FIG. 1, a diagram illustrating a system for converting time intervals is depicted in accordance with one embodiment of the present disclosure. Circuit arrangement 100 comprises a first time-to-digital converter 102, a second time-to-digital converter 104 and a third time-to-digital converter 106. The third time-to-digital converter 106 is coupled to the first time-to-digital converter 102 and the second time-to-digital converter 104. The first time-to-digital converter 102 has a first resolution, the second time-to-digital converter 104 has a second resolution and the third time-to-digital converter 106 has a third resolution.

Figure 2:
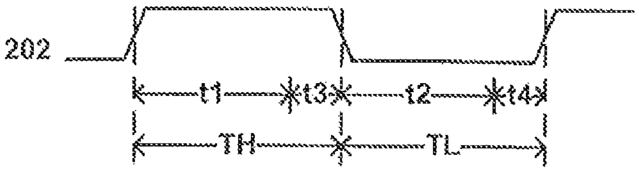
FIG. 2 is a diagram of a time profile of a signal in accordance with one embodiment of the present disclosure.

Referring to FIG. 2, a diagram of a time profile of a signal is depicted in accordance with one embodiment of the present disclosure. Signal 202 is a pulse-modulated signal which has the value of a logic '1' during a high phase or during a period TH and which has the value of a logic '0' during a low phase or during a period TL.

Circuit arrangement 100 in FIG. 1 may be used to measure both the period TH and the period TL of the signal 202 and to convert them into digital values. For the conversion of the period or time interval TH, the first time-to-digital converter 102 converts a first time interval t1, which is a first interval portion of period TH. In addition, the third time-to-digital converter 106 converts a third time interval t3, which is a second interval portion of period TH. The third time interval t3 follows the first time interval t1 in time, and the first time interval t1 and the third time interval t3 together form the period TH.

For the conversion of the period or time interval TL, the second time-to-digital converter 104 converts a second time interval t2, which is a first interval portion of the period TL. In addition, the third time-to-digital converter 106 converts a fourth time interval t4, which is a second interval portion of the period TL. The fourth time interval t4 follows the second time interval t2 in time, and the second time interval t2 and the fourth time interval t4 together form the period TL.

Circuit arrangement 100 in FIG. 1 allows conversion of successive time intervals TH and TL without dead time. A dead time in one of the two time-to-digital converters 102, 104 is avoided by virtue of a conversion being performed by the respective time-to-digital converters 102, 104. The first time-to-digital converter 102 has a certain dead time after the conversion of the first time interval t1. During this dead time in the first time-to-digital converter 102, the time interval TL is converted in the second time-to-digital converter 104.

The conversion of the time interval TH does not take place completely in the first time-to-digital converter 102, but rather a portion of the time interval TH is converted in the third time-to-digital converter 106. Similarly, the time interval TL is not converted completely in the second time-to-digital converter 104, but rather it is partially converted in the third time-to-digital converter 106. The first time-to-digital converter 102 and the second time-to-digital converter 104 share the third time-to-digital converter 106 for the conversion of time intervals. The conversion of a portion of the time intervals by a common time-to-digital converter, such as the third time-to-digital converter 106, allows a low surface area requirement for circuit arrangement 100. Since the time intervals t3, t4 which are converted by the third time-to-digital converter 106 are not adjacent to one another in time, a possible dead time in the third time-to-digital converter 106 is insignificant.

In FIG. 2, the time interval TL directly follows the time interval TH in time, and the time intervals TL, TH do not overlap. In other exemplary embodiments, the time intervals TL, TH may partially overlap or the time intervals TL, TH may not follow one another directly in time.

Figure 3:
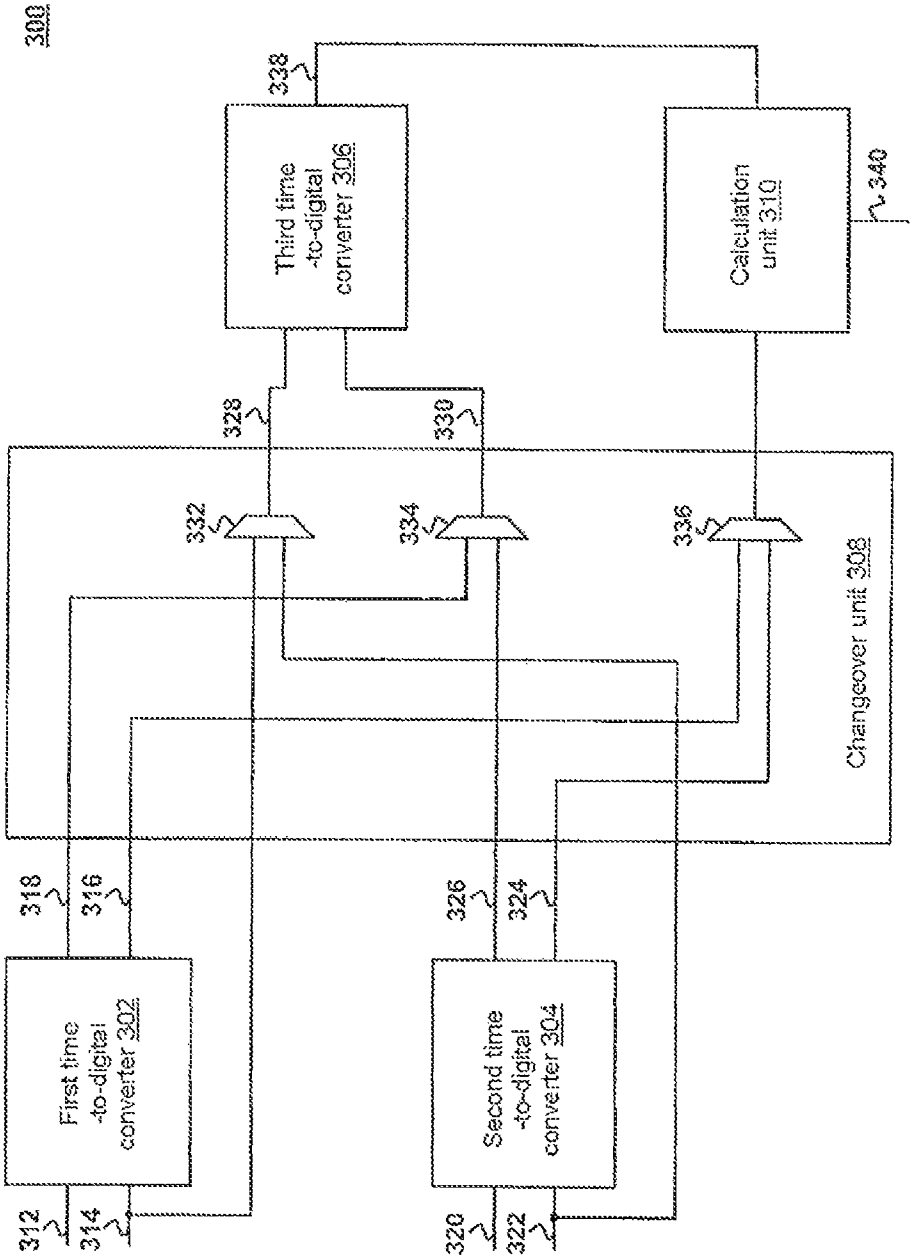
FIG. 3 is a diagram illustrating an embodiment of a system for converting time intervals in accordance with an alternative embodiment of the present disclosure.

Referring to FIG. 3, a diagram illustrating an embodiment of a system for converting time intervals is depicted in accordance with an alternative embodiment of the present disclosure. Circuit arrangement 300 comprises a first time-to-digital converter 302, a second time-to-digital converter 304, a third time-to-digital converter 306, a changeover unit 308 and a calculation unit 310. The changeover unit 308 is used to couple either the first time-to-digital converter 302 or the second time-to-digital converter 304 to the third time-to-digital converter 306. As illustrated in the embodiment from FIG. 2, the first time-to-digital converter 302 and the second time-to-digital converter 304 share the third time-to-digital converter 306.

The first time-to-digital converter 302 receives a first start signal 312 and a first stop signal 314. The first start signal 312 is used in the first time-to-digital converter 302 to control a beginning of a conversion of a first time interval, and the first stop signal 314 is used in the first time-to-digital converter 302 to control an end of the conversion of the first time interval. The first time-to-digital converter 302 outputs one or more output signals 316 which indicate a digital value of the converted, first time interval. The calculation unit 310 receives the one or more output signals 316 via the changeover unit 308. The first time-to-digital converter 302 also outputs a first control signal 318 which is coupled by the changeover unit 308 to the third time-to-digital converter 306 in order to control it.

In a similar manner, the second time-to-digital converter 304 receives a second start signal 320 and a second stop signal 322. The second start signal 320 is used in the second time-to-digital converter 304 to control a beginning of a conversion of a second time interval, and the second stop signal 322 is used in the second time-to-digital converter 304 to control an end of the conversion of the second time interval. The second time-to-digital converter 304 outputs one or more output signals 324 which indicate a digital value of the converted, second time interval. The calculation unit 310 receives the one or more output signals 324 via the changeover unit 308. The second time-to-digital converter 304 also outputs a second control signal 326 which is coupled by the changeover unit 308 to the third time-to-digital converter 306 in order to control it.

The third time-to-digital converter 306 receives a third start signal 328 and a third stop signal 330. The third start signal 328 is used in the third time-to-digital converter 306 to control a beginning of a conversion of a third and a fourth time interval. The third stop signal 330 is used in the third time-to-digital converter 306 to control an end of the conversion of the third and fourth time intervals. The third time-to-digital converter 306 converts the third time interval into a third digital value and the fourth time interval into a fourth digital value. The third time-to-digital converter 302 outputs one or more output signal 338 which indicate the digital value of the converted, third or fourth time interval, and the calculation unit 310 receives the one or more output signal 338.

The control of the beginning and the end of the conversion of the third time interval in the third time-to-digital converter 306 is derived from the first start signal 312 and the first stop signal 314, which control the conversion of the first time interval. In other words, the third time interval is derived from the first time interval, and there is a time reference between the first time interval and the third time interval. As FIG. 3 shows, the first stop signal 314 is coupled to the third start signal 328 by a first multiplexer 332 of the changeover unit 308. The conversion of the third time interval is therefore started at the end of the conversion of the first time interval. The first control signal 318 is coupled to the third stop signal 330 by a second multiplexer 334 of the changeover unit 308. The end of the conversion of the third time interval is therefore controlled by the first time-to-digital converter 302, which produces the first control signal 318 internally.

Similarly, the control of the beginning and the end of the conversion of the fourth time interval in the third time-to-digital converter 306 is derived from the second start signal 320 and the second stop signal 322, which control the conversion of the second time interval. In other words, the fourth time interval is derived from the second time interval, and there is a time reference between the second time interval and the fourth time interval. As FIG. 3 shows, the second stop signal 322 is coupled to the third start signal 328 by the first multiplexer 332 of the changeover unit 308. The conversion of the fourth time interval is therefore started at the end of the conversion of the second time interval. The second control signal 326 is coupled to the third stop signal 330 by the second multiplexer 334 of the changeover unit 308. The end of the conversion of the fourth time interval in the third time-to-digital converter 306 is therefore controlled by the second time-to-digital converter 304, which produces the second control signal 326 internally.

In one exemplary embodiment, the first time-to-digital converter 302 has a first resolution which is the same as a second resolution of the second time-to-digital converter 304. In this case, the first or second resolution is lower than a third resolution of the third time-to-digital converter 306. In other words, the first time-to-digital converter 302 and the second time-to-digital converter 304 each have a coarse resolution and the third time-to-digital converter 306 has a fine resolution. The first time-to-digital converter 302 is used to perform coarse quantization of the first time interval, and the second time-to-digital converter 304 is used to perform coarse quantization of the second time interval. The third time-to-digital converter 306, which is selectively coupled to the first time-to-digital converter 302 and the second time-to-digital converter 304, performs respective fine quantization of the third and fourth time intervals.

The first digital value, which is output by the first time-to-digital converter 302, corresponds to a length of the first time interval, but is subject to a coarse quantization error on account of the low resolution. As already described above with reference to FIG. 3, the third time interval is derived from the first time interval. In this case, the third time interval is derived from the first time interval such that the coarse quantization error caused in the first time-to-digital converter 302 can be corrected. The third time-to-digital converter 306 converts the third time interval into a third digital value, and the high resolution means that this conversion causes no or a small quantization error.

The calculation unit 310 receives the one or more output signals 316, which indicate a first digital value of the converted, first time interval, via a third multiplexer 336 of the changeover unit 308, and the calculation unit 310 also receives one or more output signals 338 which indicate a third digital value of the converted, third time interval. The quantization error in the first time-to-digital converter 302 is corrected via the calculation unit 310 by calculating a corrected digital value, which corresponds to the first time interval, from the first digital value and the third digital value. The calculation unit 310 outputs a result signal 340 which indicates the corrected digital value of the converted first time interval.

In a similar manner, the second digital value, which is output by the second time-to-digital converter 304, corresponds to a length of the second time interval, but is subject to a coarse quantization error on account of the low resolution. As already described further above with reference to FIG. 3, the fourth time interval is derived from the second time interval. In this case, the fourth time interval is derived from the second time interval such that the coarse quantization error caused in the second time-to-digital converter 304 can be corrected. The third time-to-digital converter 306 converts the fourth time interval into a fourth digital value, and the high resolution means that this conversion causes no or a small quantization error. The calculation unit 310 receives the one or more output signals 324, which indicate a second digital value of the converted, second time interval, via the third multiplexer 336 of the changeover unit 308, and the calculation unit 310 also receives one or more output signals 338 which indicate a fourth digital value of the converted, fourth time interval. The quantization error in the second time-to-digital converter 304 is corrected by the calculation unit 310 by calculating a corrected digital value, which corresponds to the second time interval, from the second digital value and the fourth digital value. The calculation unit 310 outputs the result signal 340, which indicates the corrected digital value of the converted second time interval.

Circuit arrangement 300 performs hierarchic measurement of the first time interval. The first time interval is first of all converted into a first digital value, which is subject to a coarse quantization error, by the first time-to-digital converter 302. Then, a third time interval, which is derived from the first time interval, is converted into a third digital value by the third time-to-digital converter 306, with no or a small quantization error occurring. The third time-to-digital converter 306 is hierarchically subordinate to the first time-to-digital converter 302 in this case. Similarly, the circuit arrangement 300 performs hierarchic measurement of the second time interval.

In circuit arrangement 300, the third time-to-digital converter 306 is selectively coupled to the first time-to-digital converter 302 and to the second time-to-digital converter 304 in order to correct a coarse quantization error which is caused by the first time-to-digital converter 302 or by the second time-to-digital converter 304. The conversion in the third time-to-digital converter 306 causes no or a small quantization error.

The coarse quantization error is corrected by the third time-to-digital converter 306. A mismatch between the first time-to-digital converter 302 and the second time-to-digital converter 304 may be kept to a minimum by appropriate design measures. Since the coarse quantization error is corrected the third time-to-digital converter 306, no mismatch occurs in this case. Within the circuit arrangement 300, the conversion of the first and second time intervals generates no periodically occurring conversion errors, even if there is a mismatch between the first time-to-digital converter 302 and the second time-to-digital converter 304.

Figure 4:
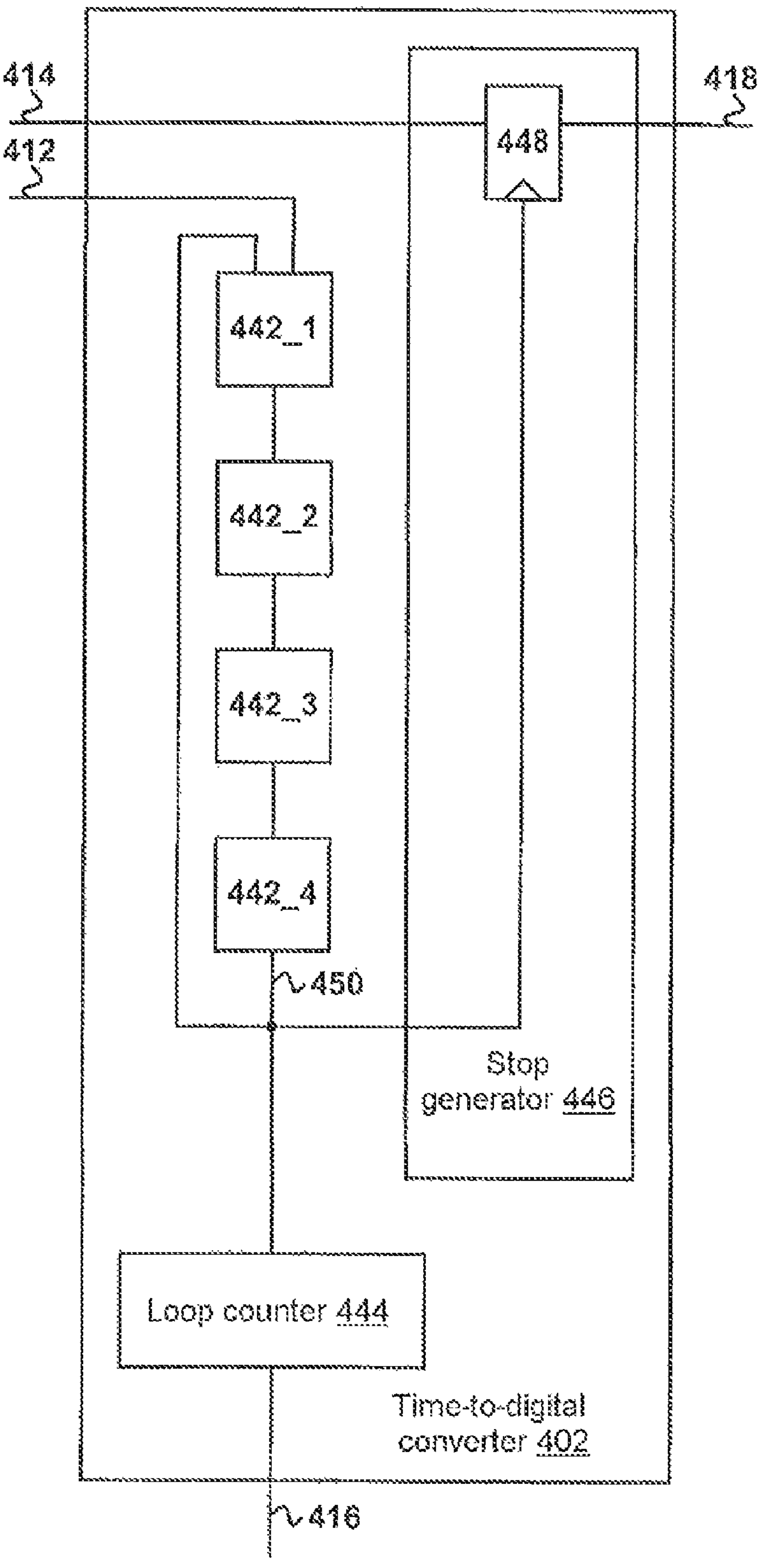
FIG. 4 is a diagram of a time-to-digital converter in accordance with one embodiment of the present disclosure.

Referring to FIG. 4, a diagram of a time-to-digital converter is depicted in accordance with one embodiment of the present disclosure. By way of example, the time-to-digital converter 402 may be used as a first 102, 302 or as a second 104, 304 time-to-digital converter in the circuit arrangements from FIG. 1 and FIG. 3. The time-to-digital converter 402 comprises a loop counter 444, a stop generator 446 and a plurality of delay elements 442_1-442_4 which are connected in a ring or in a loop. A first delay element 442_1 receives a start signal 412, which triggers a time event to control the beginning of a conversion of a time interval in the time-to-digital converter 402. The time event received on the start signal 412 propagates through the delay elements 442_1-442_4. An output of a fourth delay element 442_4 outputs a signal 450 which is returned to an input of a first delay element 442_1 in order to close the loop and to inject the time event which was delayed in the delay elements 442_1-442_4 into the loop again.

The output of the fourth delay element 442_4 is also coupled to the loop counter 444. The loop counter 444 counts a number of iterations which the time event propagates through the delay elements 442_1-442_4. By way of example, the loop counter 444 comprises a counter whose count is incremented by the value '1' each time that the time event reaches the output of the fourth delay element 442_4. The loop counter 444 performs a coarse conversion of the time interval. The loop counter 444 outputs one or more output signals 416 which indicate a digital value of the coarsely converted time interval.

The stop generator 446 is also coupled to the output of the fourth delay element 442_4 and receives a stop signal 414. The stop generator 446 comprises a sampling element 448 and outputs a control signal 418 which controls an end of a conversion of a time interval in another time-to-digital converter. As shown and described with reference to FIG. 3, the control signal 418 may be coupled to another time-to-digital converter which performs fine conversion of the time interval. By way of example, the sampling element 448 is a flip-flop, wherein the stop signal 414 is injected into a data input of the flip-flop and wherein a clock input of the flip-flop is coupled to the output of the fourth delay element 442_4.

The delay elements 442_1-442_4 may be implemented as any desirable circuit element which delays the propagation of a signal. By way of example, each of the delay elements 442_1-442_4 respectively comprises a buffer, an inverter or an amplifier. A time event may be a pulse, an edge or a spike.

Figure 5:
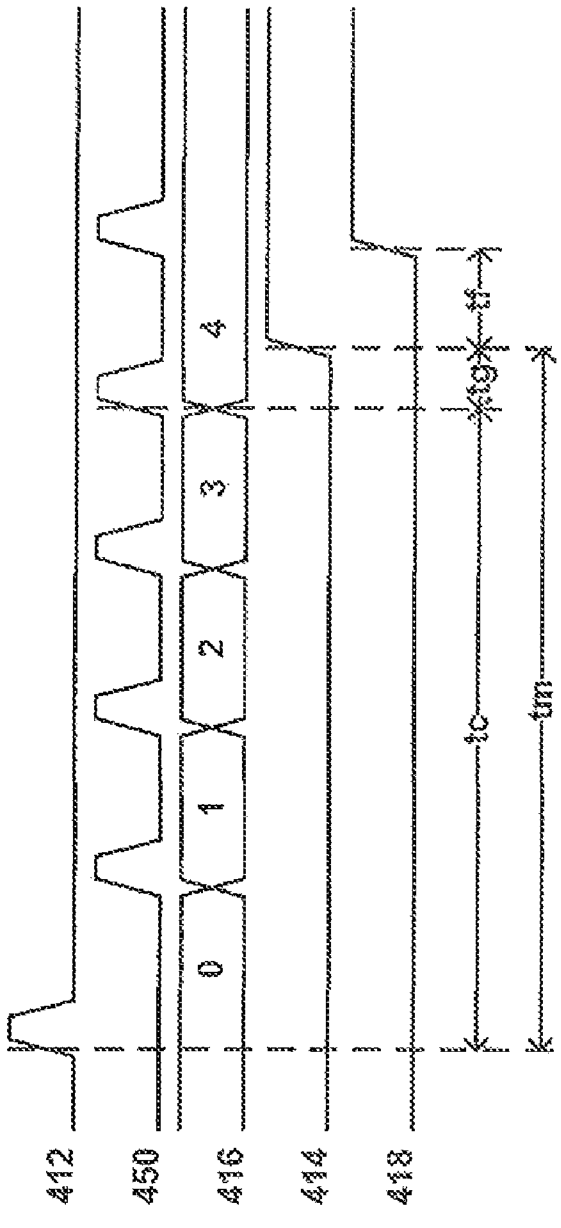
FIG. 5 is a diagram of a time profile of signals of a time-to-digital converter in accordance with one embodiment of the present disclosure.

Referring to FIG. 5, a diagram of a time profile of signals of a time-to-digital converter is depicted in accordance with one embodiment of the present disclosure. By way of example, the signals show a mode of operation of the embodiments shown in FIG. 3 and FIG. 4.

A time event in the form of a pulse on the start signal 412 starts a conversion of a time interval tm which is to be converted in the time-to-digital converter 402. The pulse propagates through the delay elements 442_1-442_4 as far as the output of the fourth delay element 442_4, which outputs the signal 450. Once the pulse has reached the output of the fourth delay element 442_4, it prompts an increase in a count in the loop counter 444, and the output signals 416 at the output of the loop counter 444 indicate a digital value which corresponds to a count increased by the value '1'. As FIG. 5 shows, the pulse transits the ring of delay elements 442_1-442_4 completely four times before the stop signal 414 becomes active by changing from the value of a logic '0' to the value of a logic '1'. The activation of the stop signal 414 terminates the conversion of the time interval tm in the time-to-digital converter 402, and the count in the loop counter 444 is no longer increased further.

As FIG. 5 shows, a time interval tc converted by the time-to-digital converter 402 does not correspond exactly to the time interval tm which is to be measured. A time interval tc actually converted by the time-to-digital converter 402 starts at the pulse of the start signal 412 and ends at the time of the last increase in the count in the loop counter 444. A period of time tg situated between the time of the last increase in the count in the loop counter 444 and the activation of the stop signal 414 is not covered by the time-to-digital converter 402. The digital value which is output on the output signals 416 is subject to a quantization error which is caused by the low or coarse resolution of the time-to-digital converter 402. The resolution of the coarse time-to-digital converter 402 is defined by the delay that a time event undergoes when it propagates the loop of delay elements 442_1-442_4 completely once.

As already described with reference to FIG. 3 and FIG. 4, the quantization error can be corrected by means of additional time-to-digital converter which is coupled to the time-to-digital converter 402 and which has a high resolution. The additional time-to-digital converter converts an additional time interval tf which is derived from the time interval tc or tm. The additional, fine time-to-digital converter corresponds to the third time-to-digital converter 306 as illustrated and described in FIG. 3, for example, and the additional time interval tf corresponds to the third time interval described in FIG. 3, for example. The time interval tm to be measured and the time interval tc actually converted by the time-to-digital converter 402 correspond to the first time interval described in FIG. 3.

As FIG. 5 shows and in a similar manner to that described with reference to FIG. 3, a conversion of the time interval tf in the additional time-to-digital converter is started with the activation of the stop signal 414. An end of the conversion in the additional time-to-digital converter is controlled by the time-to-digital converter 402 using the control signal 418. As described with reference to FIG. 4, the control signal 418 is produced by the time-to-digital converter 402. The control signal 418 is activated by virtue of it changing from the value of a logic '0' to the value of a logic '1'. The time-to-digital converter 402 activates the control signal 418 after the stop signal 414 has been activated and after the time event has reached the output of the fourth delay element 442_4 again. Activation of the control signal 418 prompts an end to the conversion of the additional time interval tf in the additional time-to-digital converter.

A digital value which is output by the additional time-to-digital converter corresponds to the time interval tf and is subjected to no or a small quantization error. The quantization error caused by the coarse time-to-digital converter 402 can be corrected by calculating a corrected digital value which corresponds to the time interval tm which is to be measured. By way of example, the correction can be made in a calculation unit 310, as has been shown and described with reference to FIG. 3, with the calculation unit 310 receiving a digital value output by the time-to-digital converter 402 and a digital value output by the additional time-to-digital converter.

For the coarse measurement of the time interval tm or tc, it is possible to use a coarse time-to-digital converter with a low resolution. By way of example, the coarse time-to-digital converter may be in the form of a loop time-to-digital converter, as has been described with reference to FIG. 3 and FIG. 4. A coarse time-to-digital converter has a low surface area requirement and a low power consumption. The fine measurement of the time interval tf requires a fine time-to-digital converter with a high resolution. By way of example, a Vernier time-to-digital converter or an interpolation time-to-digital converter can be used for the fine measurement. A fine time-to-digital converter has a high power consumption. As FIG. 5 shows, the time interval tf which is measured by the fine time-to-digital converter is short in comparison with the time interval tm or tc which is measured by the coarse time-to-digital converter.

The fine time-to-digital converter is therefore in operation only for a relatively short period of time, and the high power consumption of the fine time-to-digital converter occurs only during a relatively short period of time. Furthermore, a fine time-to-digital converter has a high surface area requirement. As FIG. 3 shows, the fine time-to-digital converter can be used jointly by a plurality of coarse time-to-digital converters, however, by virtue of the fine time-to-digital converter being selectively coupled to one of the coarse time-to-digital converters.

Figure 6:
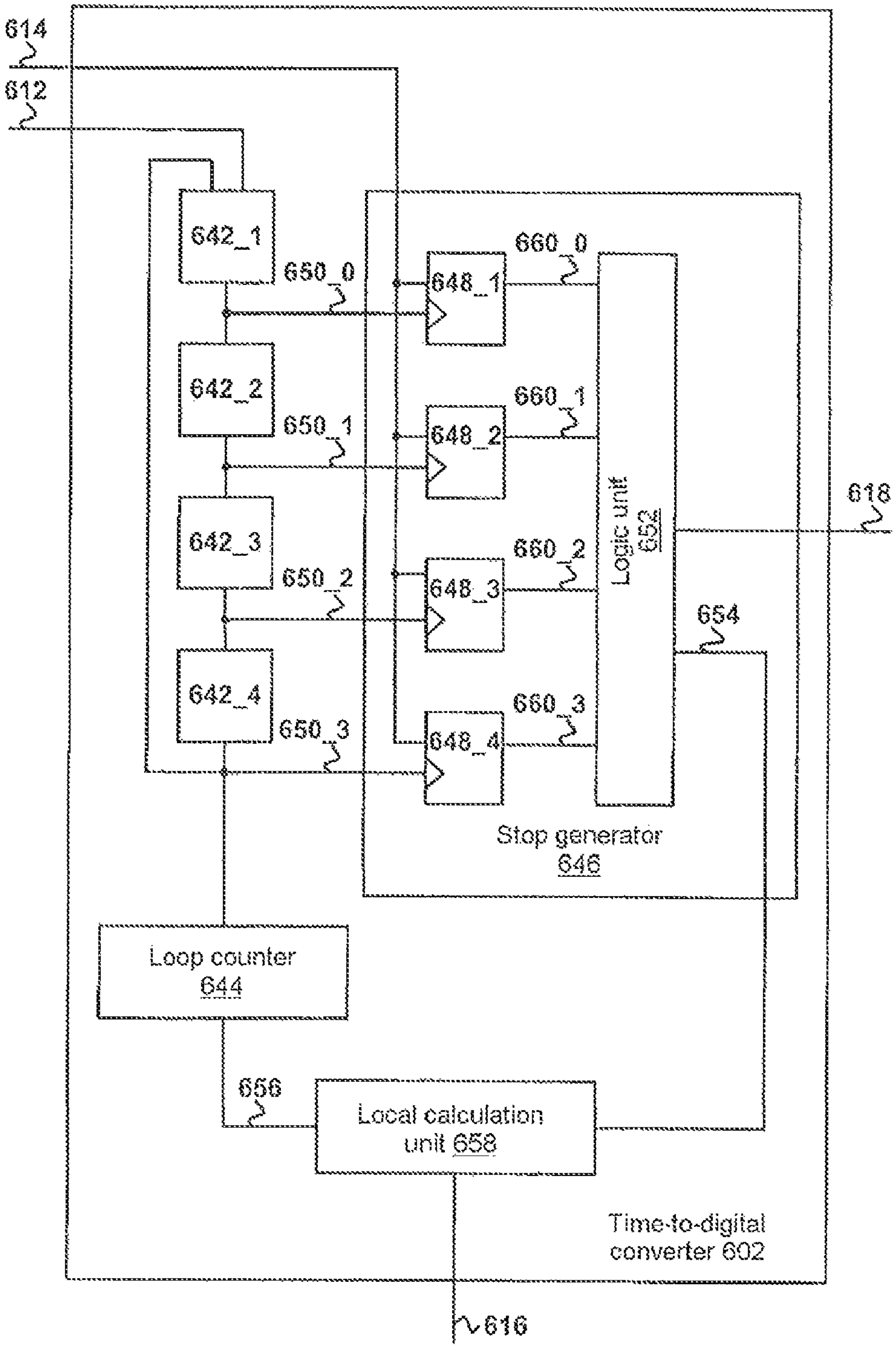
FIG. 6 is a diagram of a time-to-digital converter in accordance with an alternative embodiment of the present disclosure.

Referring to FIG. 6, a diagram of a time-to-digital converter is depicted in accordance with an alternative embodiment of the present disclosure. By way of example, the time-to-digital converter 602 can be used in the circuit arrangements from FIG. 1 and FIG. 3 as a first or a second time-to-digital converter. The time-to-digital converter 602 is an extension of the time-to-digital converter 402 which has been shown and described with reference to FIG. 4. In a similar manner to the time-to-digital converter 402 from FIG. 4, the time-to-digital converter 602 receives a start signal 612 and a stop signal 614, and it outputs a control signal 618 which can control an end of a conversion of a time interval in an additional time-to-digital converter. In a similar manner to the time-to-digital converter 402 from FIG. 4, the time-to-digital converter 602 comprises a plurality of delay elements 642_1-642_4 which are connected in a ring or loop counter 644 into which a signal 650_3 which is output by a fourth delay element 642_4, and a stop generator 646.

In contrast to the time-to-digital converter 402 from FIG. 4, the stop generator 646 of the time-to-digital converter 602 comprises a plurality of sampling elements 648_1-648_4 and a logic unit 652. By way of example, the sampling elements 648_1-648_4 are in the form of flip-flop elements, with the stop signal 614 being input into a data input of each of the plurality of delay elements 642_1-642_4 and with a clock input of each of the plurality of sampling elements 648_1-

648_4 being respectively coupled to an output of one of the plurality of delay elements 642_1-642_4. Each of the plurality of sampling elements 648_1-648_4 therefore has a respective associated delay element 642_1-642_4. In the time-to-digital converter 602, the plurality of delay elements 642_1-642_4 are used to divide a transmit time which a time event requires in order to transmit the ring of delay elements 642_1-642_4 completely once into a plurality of phases. The logic unit 652 is coupled to the outputs of the plurality of delay elements 642_1-642_4 via the sampling elements 648_1-648_4 and outputs one or more signals 654 which indicate a digital value for that phase which the time event was in when the stop signal 614 was activated.

The signals 654 which indicate a digital value for the phase are input into a local calculation unit 658 in the same way as signals 656 which indicate at an output of the loop counter 644 a number of iteration loops which the time event has passed through. The local calculation unit 658 is part of the time-to-digital converter 602 and outputs one or more output signals 616 which indicate a digital value of the time interval converted in the time-to-digital converter 602.

The logic unit 652 also produces a control signal 618 at an output which can control an end of a conversion of a time interval in an additional time-to-digital converter. Furthermore, the logic unit 652 controls enable inputs of the sampling elements 648_1-648_4 and of the loop counter 644. The enable inputs and corresponding enable control lines are not shown in FIG. 6 for the sake of clarity.

The resolution of the time-to-digital converter 602 is essentially determined by a delay in which a time event occurs in one of the plurality of delay elements 642_1-642_4. In comparison with the time-to-digital converter 402 from FIG. 4, the time-to-digital converter 602 has a higher resolution, since the transmit time of the time event in the ring of delay elements 642_1-642_4 is divided into a plurality of phases. Since the time-to-digital converter 602 comprises four delay elements 642_1-642_4, the transmit time is divided into four phases, namely phase 0, phase 1, phase 2 and phase 3. An additional time-to-digital converter, which is coupled to the time-to-digital converter 602 in order to correct a quantization error, merely needs to have a small measurement range. The additional time-to-digital converter therefore has only a low surface area requirement and a low power requirement.

Figure 7:
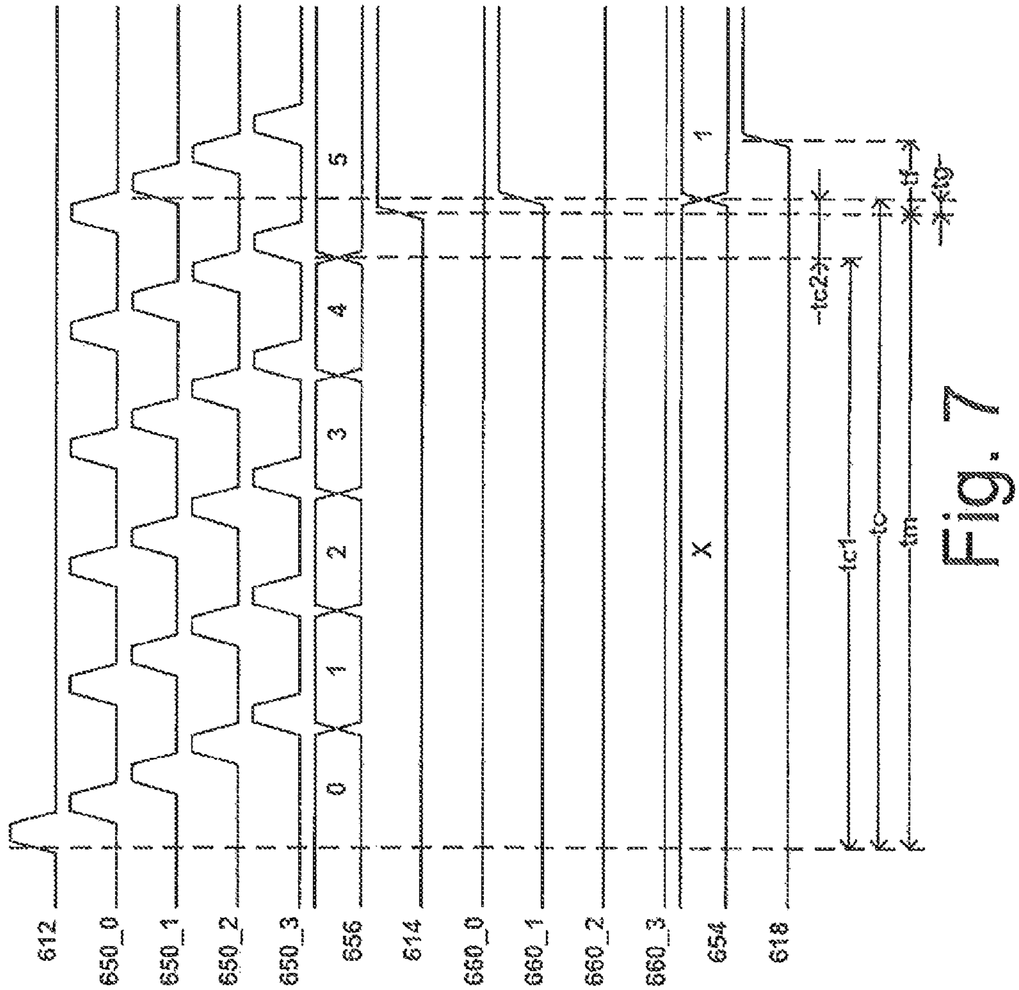
FIG. 7 is a diagram of a time profile of signals of a time-to-digital converter in accordance with an alternative embodiment of the present disclosure.

Referring to FIG. 7, a diagram of a time profile of signals of a time-to-digital converter is depicted in accordance with an alternative embodiment of the present disclosure. The signals show a mode of operation of the embodiments presented in FIG. 3 and FIG. 4 by way of example.

A time event in the form of a pulse on the start signal 612 starts a conversion of a time interval tm which is to be converted in the time-to-digital converter 602. The pulse propagates through the delay elements 642_1-642_4, the outputs of which output the signals 650_0-650_3. Once the pulse has reached the output of the fourth delay element 642_4, it prompts an increase in a count in the loop counter 644, and the output signals 656 at the output of the loop counter 644 indicate a digital value which corresponds to a count increased by the value '1'. As FIG. 6 shows, the pulse transmits through the ring of delay elements 642_1-642_4 completely five times before the stop signal 614 becomes active by changing from the value of a logic '0' to the value of a logic '1'. The activation of the stop signal 614 prompts the count in the loop counter 644 to be increased no further.

The activation of the stop signal 614 also prompts a signal 660_1 at an output of the flip-flop element 648_2 to be set to the value of a logic '1'. The logic unit 652 then outputs the digital value '1' on the signals 654. This indicates that the time event was in phase 1 at the time at which the stop signal 614 was activated. The other flip-flop elements 648_1, 648_3, 648_4 are deactivated as soon as the stop signal 614 has been sampled in the flip-flop element 648_2.

As FIG. 7 shows, a count indicated by the loop counter 644 corresponds to the time interval tc1. A value indicated by the logic unit 652 corresponds to the time interval tc2. The local calculation unit 658 performs weighting of the value which is output by the logic unit 652, and adds this weighted value to the value which is output by the loop counter 644. The local calculation unit 658 outputs a value corresponding to the time interval tc on the output signals 616. This time interval tc does not correspond exactly to the time interval tm which is to be measured. A time interval tc actually converted by the time-to-digital converter 602 starts with the pulse of the start signal 412 and ends at the time at which the time event arrives at the output of the flip-flop element 642_2. In this case, a period of time tg between the activation of the stop signal 614 and the time at which the time event arrives at the output of the flip-flop element 642_2 is covered excessively by the time-to-digital converter 602. The value which is output on the output signals 616 is subject to a quantization error which is caused by the low or coarse resolution of the time-to-digital converter 602.

As already described with reference to FIG. 3, FIG. 4 and FIG. 6, the quantization error can be corrected by means of an additional time-to-digital converter which is coupled to the time-to-digital converter 602 and which has a high resolution. The additional time-to-digital converter converts an additional time interval tf which is derived from the time interval tc or tm. The additional, fine time-to-digital converter corresponds to the third time-to-digital converter 306 presented and described in FIG. 3, for example, and the additional time interval tf corresponds to the third time interval described in FIG. 3, for example. The time interval tm to be measured and the time interval tc actually converted by the time-to-digital converter 602 corresponds to the first time interval described in FIG. 3, for example.

As FIG. 7 shows and as described in a similar manner to that with reference to FIG. 3, a conversion of the time interval tf in the additional time-to-digital converter is started when the stop signal 614 is activated. An end of the conversion in the additional time-to-digital converter is controlled by the time-to-digital converter 602 using the control signal 618. As described with reference to FIG. 6, the control signal 618 is produced by the time-to-digital converter 602. The control signal 618 is activated by changing from the value of a logic '0' to the value of a logic '1'. The time-to-digital converter 602 activates the control signal 618 after the stop signal 614 has been activated. As FIG. 7 shows, the time-to-digital converter 602 activates the control signal 618 with a delay of two phases after the signal 660_1 at the output of the flip-flop element 648_2 has been set to the value of a logic '1', for example. Activation of the control signal 618 prompts an end of the conversion of the further time interval tf in the additional time-to-digital converter. A digital value which is output by the additional time-to-digital converter corresponds to the time interval tf and is subject to no or a small quantization error.

The quantization error, caused by the coarse time-to-digital converter 602, can be corrected by calculating a corrected digital value which corresponds to the time interval tm which is to be measured. By way of example, the correction can be made in a calculation unit of a circuit arrangement, as has been shown and described with reference to FIG. 3, with the calculation unit receiving a digital value which is output by the time-to-digital converter 602 and a digital value which is output by the additional time-to-digital converter.

Figure 8:
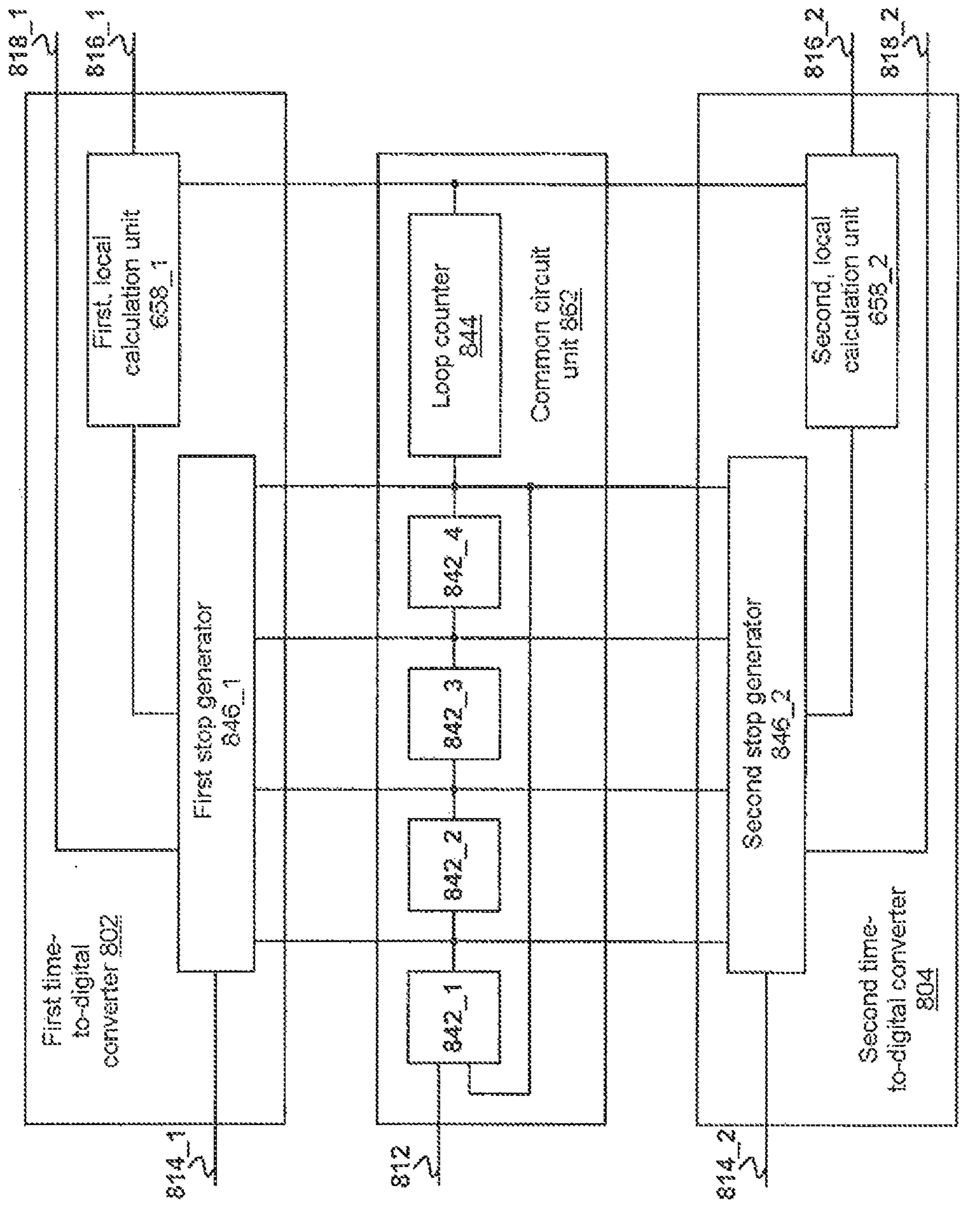
FIG. 8 is a diagram of two time-to-digital converters in accordance with one embodiment of the present disclosure.

Referring to FIG. 8, a diagram of two time-to-digital converters is depicted in accordance with one embodiment of the present disclosure. By way of example, the time-to-digital converters can be used in the circuit arrangements from FIG. 1 and FIG. 3 as first and second time-to-digital converters. The first time-to-digital converter 802 and the second time-to-digital converter 804 have the same logical circuit design, which is similar to the logical circuit design of the time-to-digital converter 602, as has been shown and described with reference to FIG. 6. The first time-to-digital converter 802 receives a first stop signal 814_1 and outputs a first control signal 818_1 and first output signals 816_1 which indicate a digital value of the time interval converted in the first time-to-digital converter 802. The first time-to-digital converter 802 comprises a first stop generator 846_1 and a first, local calculation unit 658_1. The second time-to-digital converter 804 receives a second stop signal 814_2 and outputs a second control signal 818_2 and second output signals 816_2 which indicate a digital value of the time interval converted in the second time-to-digital converter 804. The second time-to-digital converter 804 comprises a second stop generator 846_2 and a second, local calculation unit 658_2.

The first time-to-digital converter 802 and the second time-to-digital converter 804 are coupled to a common circuit unit 862. The common circuit unit 862 receives a start signal 812 and comprises a plurality of delay elements 842_1-842_4, which are connected as a ring, and a loop counter 844, which is coupled to an output of a fourth delay element 842_4. The logical design of the common circuit unit 862 in this case corresponds to the logical design of the delay elements 642_1-642_4 and of the loop counter 644 from FIG. 6.

When the first time-to-digital converter 802, the second time-to-digital converter 804 and the circuit unit 862 are used in the circuit arrangement 300 from FIG. 3, for example, it is not necessary for the delay elements and the loop counter to be provided separately for each time-to-digital converter 302, 304, but rather the two time-to-digital converters 302, 304 share the delay elements and the loop counter. In this case, the first time-to-digital converter 302 and the second time-to-digital converter 304 share the third time-to-digital converter 306. In addition, the first time-to-digital converter 302 and the second time-to-digital converter 304 share the delay elements 642_1-642_4 and the loop counters 644. This allows a further reduction in the surface area requirement of the circuit arrangement 300, which results in an ultracompact circuit arrangement with an optimized mode of operation without dead times and with reduced energy consumption. Since the surface area requirement determines the production costs to a considerable extent, this ultracompact circuit arrangement can achieve a substantial reduction in the production costs.

The delay elements 842_1-842_4 of the common circuit unit 862 are constantly in operation, for example, i.e. a time event propagates continually through the ring of delay elements 842_1-842_4. The conversion in the first time-to-digital converter 802 and in the second time-to-digital converter 804 is in this case controlled by the first stop signal 814_1 and the second stop signal 814_2. In another embodiment, the propagation of the time event is stopped at the end of each conversion and restarted before the beginning of a new conversion.

Figure 9:
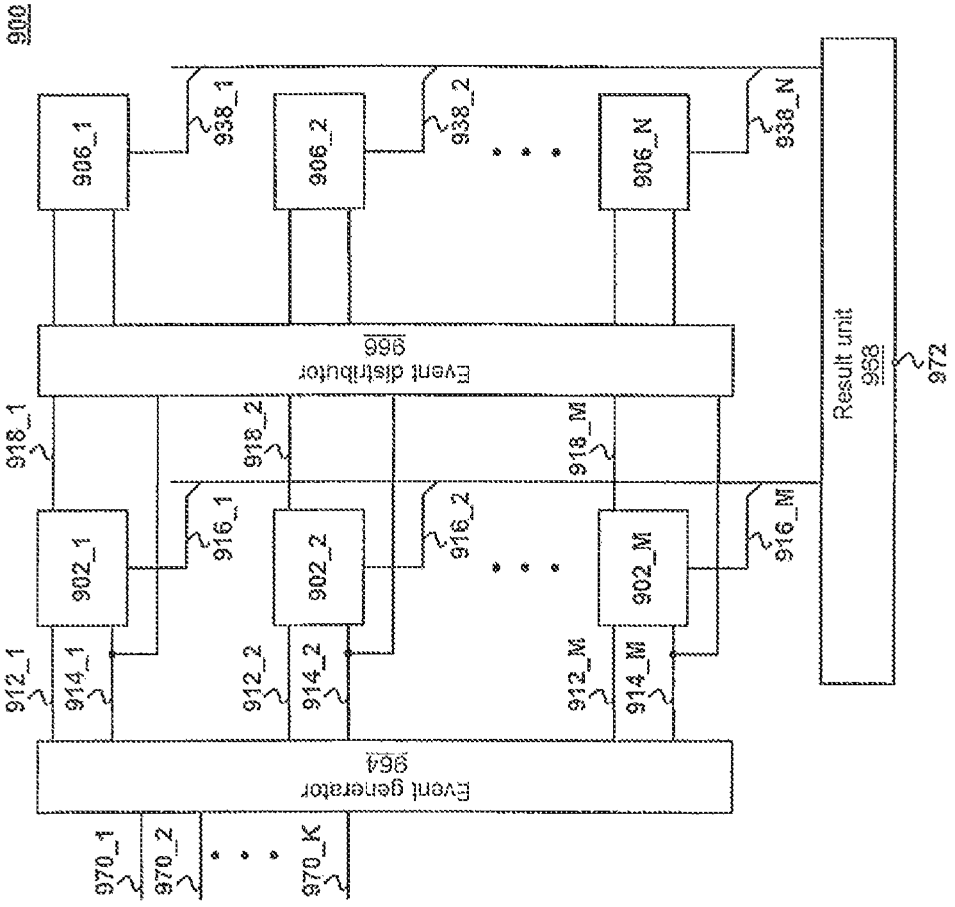
FIG. 9 is a diagram of a system for converting time intervals in accordance with one embodiment of the present disclosure.

Referring to FIG. 9, a diagram of a system for converting time intervals is depicted in accordance with one embodiment of the present disclosure. The circuit arrangement 900 comprises an event generator 964, an event distributor 966, a result unit 968, a plurality of M time-to-digital converters 902_1-902_M with a low resolution and a plurality of N time-to-digital converters 906_1-906_N with a high resolution. Each of the plurality of M time-to-digital converters 902_1-902_M has a lower resolution than each of the plurality of N time-to-digital converters 906_1-906_N. The plurality of M time-to-digital converters 902_1-902_M is subsequently referred to as coarse time-to-digital converters, and the plurality of N time-to-digital converters 906_1-906_N is subsequently referred to as fine time-to-digital converters. The plurality of coarse time-to-digital converters comprises a time-to-digital converter as has been described in the preceding sections, for example.

The event generator 964 receives a plurality of K input signals 970_1-970_K and produces time events from the input signals 970_1-970_K. The time events control a beginning and an end of a conversion of time intervals in the coarse time-to-digital converters 902_1-902_M. The time events are input into the coarse time-to-digital converters 902_1-902_M by start signals 912_1-912_M and stop signals 914_1-914_M. The coarse time-to-digital converters 902_1-902_M output output signals 916_1-916_M which indicate values of the converted time intervals. The output signals 916_1-916_M are input into the result unit 968.

The coarse time-to-digital converters 902_1-902_M also output control signals 918_1-918_M which control an end of a conversion of time intervals in the fine time-to-digital converters 902_1-902_M. The control signals 918_1-918_M and the stop signals 914_1-914_M are input into the event distributor 966, which distributes the time events on the control signals 918_1-918_M and the stop signals 914_1-914_M over the fine time-to-digital converters 906_1-906_N. The event distributor 966 selectively couples the fine time-to-digital converters 906_1-906_M to the coarse time-to-digital converters 902_1-902_M. The fine time-to-digital converters 906_1-906_N output output signals 938_1-938_N which indicate values of the time intervals converted by them. The output signals 938_1-938_N are input into the result unit 968. The result unit 968 performs postprocessing, and an output 972 outputs an overall measurement result from the circuit arrangement 900.

The event generator 964 selects one of the coarse time-to-digital converters 902_1-902_M for performing the conversion of a time interval on the basis of a random algorithm, for example. Similarly, the event distributor 966 selects one of the fine time-to-digital converters 906_1-906_N on the basis of a random algorithm, for example. By way of example, the event generator 964 and/or the event distributor 966 comprises a digital multi-bit sigma-delta converter in order to produce the random algorithm. The use of random algorithms for the selection of the time-to-digital converters 902_1-902_M, 906_1-906_N makes it possible to avoid occurrence of periodicities at the output 972.

In order to achieve a low surface area requirement for the circuit arrangement 900, one or more coarse time-to-digital converters 902_1-902_M can be coupled to the same instance of the fine time-to-digital converters 906_1-906_N by the event distributor 966. In other words, one or more of the coarse time-to-digital converters 902_1-902_M can share one or more of the fine time-to-digital converters 906_1-906_N. In this case, the plurality of M coarse time-to-digital converters 902_1-902_M is smaller than the plurality of N fine time-to-digital converters 906_1-906_N.

Figure 10:
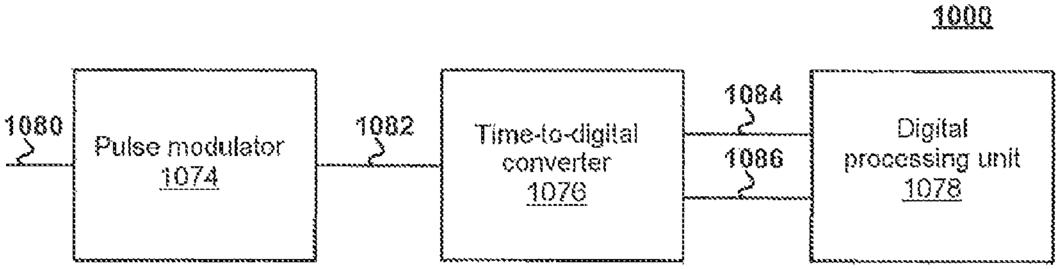
FIG. 10 is a diagram of a system for converting time intervals in accordance with yet another embodiment of the present disclosure.

Referring to FIG. 10, a diagram of a system for converting time intervals is depicted in accordance with yet another embodiment of the present disclosure. The analog-to-digital converter 1000 comprises a pulse modulator 1074, a time-to-digital converter 1076 and a digital processing unit 1078. The pulse modulator 1074 receives an analog input signal 1080 at an input and converts the input signal into a pulse-modulated signal 1082 at its output. The pulse-modulated signal 1082 is input into the time-to-digital converter 1076, which comprises a circuit arrangement, as has been described in the preceding sections.

The time-to-digital converter 1076 converts a period of a high phase of the pulse-modulated signal 1082 into a digital value and outputs the digital value at its output 1084. In addition, the time-to-digital converter 1076 converts a period of a low phase of the pulse-modulated signal 1082 into an additional digital value and outputs the digital value at its additional output 1086. The output 1084 and the additional output 1086 of the time-to-digital converter 1076 are coupled to the digital processing unit 1078, which performs postprocessing of the digital value and of the additional digital value.

Figure 11:
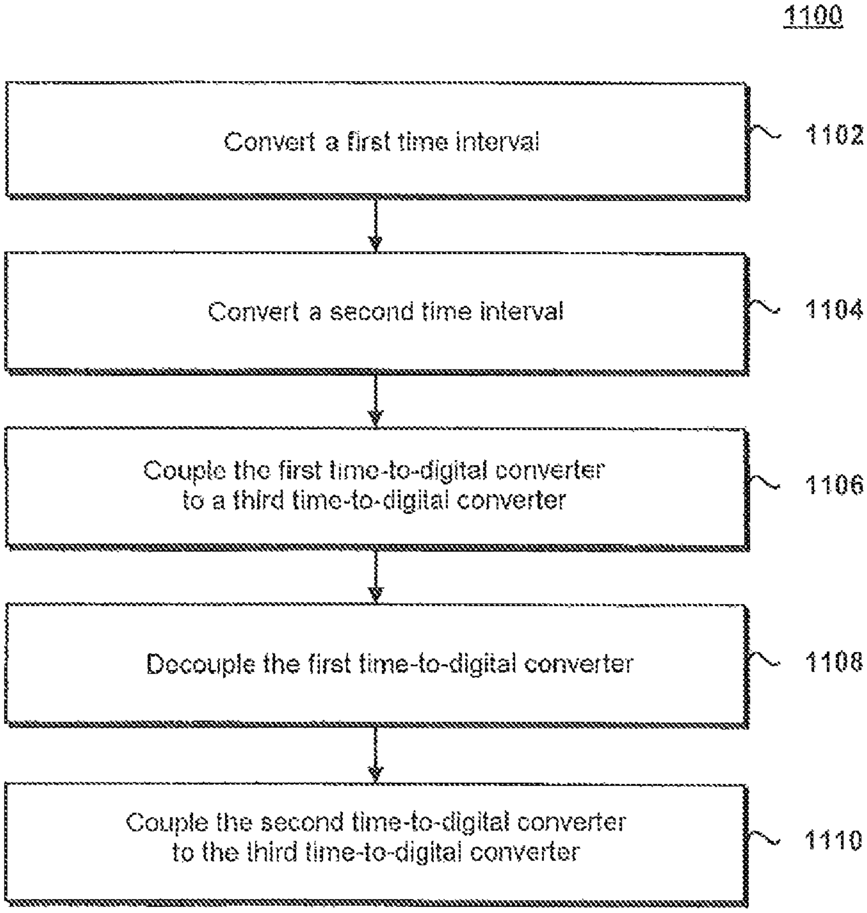
FIG. 11 is a flowchart of an exemplary process for converting time intervals in accordance with one embodiment of the present disclosure.

Referring to FIG. 11, a flowchart of an exemplary process for converting time intervals is depicted in accordance with one embodiment of the present disclosure. Process 1100 begins at step 1102 to convert a first time interval. Step 1102 may be performed by a first time-to-digital converter. Process 1100 continues to step 1104 to convert a second time interval. Step 1104 may be performed by a second time-to-digital converter. Process 1000 then continues to step 1106 to couple the first time-to-digital converter to a third time-to-digital converter for the purpose of controlling a conversion of a third time interval in the third time-to-digital converter. Process 1100 then continues to step 1108 to decouple the first time-to-digital converter from the third time-to-digital converter.

Process 1100 completes at step 1110 to couple the second time-to-digital converter to the third time-to-digital converter for the purpose of controlling a conversion of a fourth time interval in the third time-to-digital converter. The order of the steps of process 1100 does not need to correspond to the order described above. The method 1100 can be performed with one of the circuit arrangements or with one of the time-to-digital converters as have been described in the preceding sections.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A system for converting time intervals comprising:
- a first time-to-digital converter configured to convert a first time interval;
- a second time-to-digital converter configured to convert a second time interval; and
- a third time-to-digital converter and coupled to the first time-to-digital converter and the second time-to-digital converter, the third time-to-digital converter configured to convert a third time interval and a fourth time interval.

2. The system of claim 1, wherein the first time-to-digital converter has a same resolution as the second time-to-digital converter.

3. The system of claim 1, wherein the third time-to-digital converter has a higher resolution than the first time-to-digital converter and the second time-to-digital converter.

4. The system of claim 1, further comprising:
- a changeover unit coupled to the first time-to-digital converter, the second time-to-digital converter, and the third time-to-digital converter, and configured to selectively couple the third time-to-digital converter to the first time-to-digital converter or the second time-to-digital converter.

5. The system of claim 4, wherein the changeover unit is further configured to end the conversion in the third time-to-digital converter upon detection of a control signal from the first time-to-digital converter or the second time-to-digital converter.

6. The system of claim 1, wherein the first time-to-digital converter comprises:
- a first input for a first start signal indicating a beginning of a conversion of the first time interval; and
- a second input for a first stop signal indicating an end of the conversion of the first time interval.

7. The system of claim 6, wherein the second time-to-digital converter comprises:
- a third input for a second start signal indicating a beginning of a conversion of the second time interval; and
- a fourth input for a second stop signal indicating an end of the conversion of the second time interval.

8. The system of claim 1, wherein the third time interval is derived from the first time interval, and wherein the fourth time interval is derived from the second time interval.

9. The system of claim 6, wherein the third time interval is derived from the first time interval and wherein the first stop signal indicates a beginning of a conversion of the third time interval in the third time-to-digital converter, and
- wherein a control signal is generated in the first time-to-digital converter based on the first stop signal, the control signal indicating an end of the conversion of the third time interval in the third time-to-digital converter.

10. The system of claim 7, wherein the fourth time interval is derived from the second time interval, and wherein the second stop signal indicates a beginning of the conversion of the fourth time interval in the third time-to-digital converter, and
- wherein an additional control signal in the second time-to-digital converter is generated based on the second stop signal, the additional controls signal indicates an end of the conversion of the fourth time interval in the third time-to-digital converter.

11. The system of claim 1, wherein the first time-to-digital converter is configured to convert the first time interval into a first digital value, wherein the second time-to-digital converter is configured to convert the second time interval into a second digital value, and wherein the third time-to-digital converter is configured to convert the third time interval into a third digital value and the fourth time interval into a fourth digital value.

12. The system of claim 11, further comprising:
- a calculation unit coupled to the first time-to-digital converter, the second time-to-digital converter and the third time-to-digital converter,
- the calculation unit configured to calculate a first digital value corresponding to the first time interval from the first digital value and the third digital value, and a second digital value corresponding to the second time interval from the second digital value and the fourth digital value.

13. The system of claim 1, wherein the second time interval follows the first time interval in time, and wherein the first time interval and the second time interval do not overlap.

14. The system of claim 1, wherein the second time interval is directly adjacent to the first time interval in time.

15. The system of claim 1, wherein the second time interval partially overlaps the first time interval.

16. The system of claim 1, wherein the first time-to-digital converter comprises a first plurality of delay elements connected in a loop, and wherein the second time-to-digital converter comprises a second plurality of delay elements connected in a loop.

17. The system of claim 1, further comprising:

an event generator coupled to the first time-to-digital converter and the second time-to-digital converter, the event generator having at least one input signal and at least one time event generated from the at least one input signal, wherein the at least one time event indicates a beginning or an end of a conversion in the first time-to-digital converter or the second time-to-digital converter.

18. The system of claim 17, wherein the at least one time event is a pulsed signal, a signal edge or a spike.

19. A system for converting time intervals comprising:

a first plurality of time-to-digital converters comprising the first time-to-digital converter and the second time-to-digital converter;

an event generator coupled to and configured to control a conversion in the first plurality of time-to-digital converters;

a second plurality of time-to-digital converters comprising the third time-to-digital converter; and an event distributor coupled to the first plurality of time-to-digital converters and the second plurality of time-to-digital converters, wherein the event distributor is configured to control a conversion in the second plurality of time-to-digital converters.

20. The system of claim 19, wherein the first plurality of time-to-digital converters comprises M time-to-digital converters, wherein the second plurality of time-to-digital converters comprises N time-to-digital converters, and wherein N is equal to or less than M.

21. The system of claim 19, wherein the event generator is configured to select one of the first plurality of time-to-digital converters based on a random algorithm.

22. The system of claim 21, wherein the event generator comprises a digital multibit sigma-delta converter configured to produce the random algorithm.

23. The system of claim 19, wherein the event distributor is configured to select one of the second plurality of time-to-digital converters based on an additional random algorithm.

24. The system of claim 23, wherein the event distributor comprises a second digital multibit sigma-delta converter configured to produce the additional random algorithm.

25. The system of claim 19, wherein the first plurality of time-to-digital converters have a lower resolution than the second plurality of time-to-digital converters.

26. An analog-to-digital converter comprising:

a pulse modulator configured to convert an analog signal into a pulse-modulated signal;

at least one time-to-digital converter coupled to the pulse modulator configured to convert the pulse-modulated signal into at least one digital value; and a digital processing unit coupled to the at least one time-to-digital converter configured to process the at least one digital value.

27. A method for converting time intervals, comprising:

converting a first time interval in a first time-to-digital converter;

converting a second time interval in a second time-to-digital converter;

controlling a conversion of a third time interval in a third time-to-digital converter;

decoupling the first time-to-digital converter from the third time-to-digital converter; and controlling a conversion of a fourth time interval in the third time-to-digital converter.

28. The method of claim 27, further comprising:

transmitting a control signal to end the conversion of the third time interval in the third time-to-digital converter; and transmitting an additional control signal to end the conversion of the fourth time interval in the third time-to-digital converter.

29. The method of claim 27, further comprising:

receiving a first start signal;

initiating a conversion of the first time interval in the first time-to-digital converter upon receiving the first start signal;

receiving a first stop signal; and ending the conversion of the first time interval in the first time-to-digital converter upon receiving the first stop signal.

30. The method of claim 29, further comprising:

receiving a second start signal;

initiating a conversion of the second time interval in the second time-to-digital converter upon receiving the second start signal;

receiving a second stop signal; and ending the conversion of the second time interval in the second time-to-digital converter upon receiving the second stop signal.

31. The method of claim 29, further comprising:

deriving the third time interval from the first time interval; and deriving the fourth time interval from the second time interval.

32. The method of claim 31, further comprising:

initiating the conversion of the third time interval in the third time-to-digital converter upon receiving the first stop signal;

generating a control signal from the first stop signal; and ending the conversion of the third time interval in the third time-to-digital converter upon receiving the control signal.

33. The method of claim 32, further comprising:

initiating the conversion of the fourth time interval in the third time-to-digital converter upon receiving the second stop signal;

generating an additional control signal from the second stop signal; and ending the conversion of the fourth time interval in the third time-to-digital converter upon receiving the additional control signal.

34. The method of claim 27, further comprising:

converting the first time interval into a first digital value;

converting the second time interval into a second digital value;

converting the third time interval into a third digital value; and converting the fourth time interval into a fourth digital value.

35. The method of claim 34, further comprising:

calculating a digital value corresponding to the first time interval from the first digital value and the third digital value; and calculating a second digital value corresponding to the second time interval from the second digital value and the fourth digital value.

* * * * *